United States Patent [19]

Kurosawa et al.

[11] Patent Number: 4,739,169
[45] Date of Patent: Apr. 19, 1988

[54] ION SOURCE

[75] Inventors: Yukio Kurosawa; Yoshimi Hakamata; Yasunori Ohno; Kunio Hirasawa, all of Hitachi; Tadashi Sato, Mito, all of Japan

[73] Assignee: Hitachi, Ltd., Tokyo, Japan

[21] Appl. No.: 914,196

[22] Filed: Oct. 1, 1986

[30] Foreign Application Priority Data

Oct. 4, 1985 [JP] Japan ............................ 60-220115

[51] Int. Cl.$^4$ ................................................ H05H 1/24
[52] U.S. Cl. .................................. 250/423 R; 250/427; 315/111.81
[58] Field of Search ..................... 250/423, 427; 315/111.81

[56] References Cited

U.S. PATENT DOCUMENTS

| 4,233,537 | 11/1980 | Limpaecher | 376/129 |
| 4,559,477 | 12/1985 | Leung et al. | 250/427 |
| 4,661,710 | 4/1987 | Verney et al. | 250/423 R |

FOREIGN PATENT DOCUMENTS

| 132015 | 2/1984 | European Pat. Off. | 250/423 R |
| 0217361 | 4/1987 | European Pat. Off. | 250/423 R |
| 5141729 | 4/1979 | Japan | 250/423 R |
| 130039 | 12/1983 | Japan | 250/423 R |

Primary Examiner—Carolyn E. Fields
Assistant Examiner—John A. Miller
Attorney, Agent, or Firm—Antonelli, Terry & Wands

[57] ABSTRACT

An ion beam for use in fabrication and processing of semiconductors, thin films or the like. For making uniform the radial distribution of an ion beam extracted from the ion source, a plasma chamber is formed by extending a plasma producing chamber in the direction in which microwave energy is introduced. The plasma chamber thus formed is provided with second magnetic means for generating a magnetic field of multicusp geometry.

10 Claims, 1 Drawing Sheet

ION SOURCE

BACKGROUND OF THE INVENTION

The present invention generally relates to an ion source. More particularly, the invention concerns an ion source which can be advantageously employed in fine processing of semiconductors, thin films or the like by making use of an ion beam.

In recent years, in accompaniment to tendency of dry semiconductor processes being increasingly adopted, there arises a great demand for an etching apparatus in which an ion beam is made use of. Implementation of semiconductor devices with high fineness has made a remarkable progress, as demonstrated by the fact that a minimum line width of the submicron order is being realized in the fabrication of LSI devices. In light of the present state of the art, the dry etching apparatus destined to perform the process with high fineness of the submicron order is imposed in respect to the performance capability thereof with such requirements that the divergence angle of the ion beam is constricted to a very small value for satisfying the desired high processing precision and that the ion beam should have a very uniform density. As exemplary structure of the ion beam etching apparatus of this sort, there may be mentioned the structure disclosed in "Extended Abstracts for The 32nd Spring Meeting, Mar. 29-Apr. 1, 1985 of The Japan Society of Applied Physics and Related Societies", p. 316. The ion beam etching apparatus disclosed in the above publication is composed of a cylindrical vacuum container serving as a vacuum chamber, a microwave waveguide connected to one end of the vacuum container, and a coil disposed around the outer periphery of the vacuum container for generating a magnetic field of the direction which is in parallel with the direction the microwave energy is introduced. A microwave power is supplied from a microwave oscillator (not shown). When the angular frequency of the microwave is represented by $\omega$ dimensions are so selected that the following relation can be satisfied at least approximately:

$$\omega = \frac{eB}{m_e} \quad (1)$$

where $m_e$ represents mass of electron, e represents electric charge of electron, and B represents density of magnetic flux. When the microwave of 2.45 MHz is used, the density of magnetic flux (B) is set approximately equal to 875 Gauss.

When the above conditions are met, electrons are accelerated due to cyclotron resonance of electrons taking place within the vacuum chamber, resulting in that ionization is promoted intensively by the accelerated electrons, whereby a plasma is produced. From this plasma, ions are extacted through ion extracting means including an electrode biased with a positive voltage, an electrode biased with a negative voltage and an electrode applied with the ground potential. This known ion source suffers however a shortcoming that the uniformity of the plasma density distribution is poor with an axial or center portion of the plasma exhibiting a higher density. As a consequence, the density of the extracted ion beam is high only at the axial center portion thereof. In other words, the ion beam as extracted is of nonuniformity in the ion density distribution in the radial direction thereof. Further, since the magnetic lines of force generated by the coil tend to leak toward the ion extracting electrode array, the paths of ions tend to be bent, giving rise to a problem that the divergence angle of the ion beam is increased.

SUMMARY OF THE INVENTION

In light of the state of the art described above, it is a primary object of the present invention to provide an ion source in which the extracted ion beam exhibits a uniform distribution of ion density in the radial direction thereof.

Another object of the present invention is to provide an ion source in which the extracted ion beam exhibits a high uniformity in the ion density distribution and an extremely small divergence angle so that the ion source can be advantageously employed in the processing requiring an extremely high fineness or precision.

In view of the first mentioned object, it is proposed according to the present invention that a plasma producing chamber for generating a plasma within the interior thereof is extended in the direction in which the microwave energy is introduced or injected, to thereby form a plasma chamber which is provided with second magnetic means for generating a magnetic field of multicusp-like geometry.

Further, in view of the second mentioned object, it is taught by the present invention that in the structure mentioned above, a magnetic shield member is provided between the second magnetic means and the first magnetic means.

DESCRIPTION OF THE PREFERRED EMBODIMENTS

Figure 1:
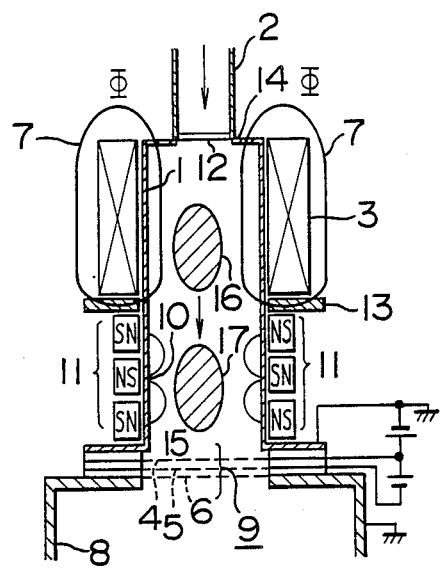
FIG. 1 is a sectional view showing an ion source according to a first embodiment of the present invention.

Now, the present invention will be described in detail in conjunction of the preferred embodiments shown in the drawings, exemplary of the invention.

FIG. 1 shows an embodiment of the ion source According to the present invention. Referring to the figure, a coil 3 for generating a magnetic field 7 ($\phi$ denotes the flux density thereof) in the axial direction is disposed around the outer periphery of a cylindrical vacuum container 1. A top end plate 14 of the vacuum container 1 has formed therein a dielectric window 12 which transmits therethrough microwave energy and is coupled to a waveguide 2 for feeding microwave energy from a microwave oscillator (not shown). In the structure according to the instant embodiment, the vacuum chamber 1 is provided with an extension extending in the axial direction to form a plasma chamber 10 having an outer periphery around which a large number of permanent magnets 11 are disposed for generating magnetic fields of multicusp geometry in both the circumferential and longitudinal directions. The plasma chamber 10 has an aperture 15 at which an ion extracting electrode array 9 including electrodes 4 and 5 biased to a positive potential and a negative potential, respectively, and a grounded electrode 6 is provided. 8 denotes a vacuum chamber having a substrate (not shown) provided therein which is subjected to matching such as etching, milling or the like with the ion beam extracted through the ion extracting electrode array 9. When microwave energy is introduced through the dielectric window 12, electrons are accelerated due to electron cyclotron resonance within the interior space of the vacuum container 1 surrounded by the magnetic field generating coil 3, whereby molecules of a neutral gas within the vacuum container 1 is ionized to produce a plasma 16. This plasma 16 diffuses in the axial direction and is confined within an inner space of the plasma chamber 10. 17 denotes the plasma confined within the plasma chamber 10. As a consequence, the plasma can present an extremely uniform density distribution in the radial direction due to the diffusion. Further, since the ion extracting electrode array 9 is disposed remotely from the coil 3 for generating the magnetic field of the axial direction, the intensity of the magnetic field generated by the coil 3 is very feeble at the location of the ion extracting electrode array 9 and scarcely exert influence to the paths of the ions. In particular, when a magnetic shield member 13 is provided between the coil 3 and the permanent magnet assembly 11 for generating the magnetic field of multicusp geometry, influence of the magnetic field generated by the coil 3 to the paths of ions extracted through the ion extracting electrode array 9 can be reduced substantially to zero. Consequently, the ion beam extracted through the ion extracting electrode array 9 has an extremely uniform distribution of ion density in the radial direction with the divergence angle of the ion beam being correspondingly set to a minimum value, whereby an ion beam can be obtained which is advantageously suited for the very fine processing.

Figure 2:
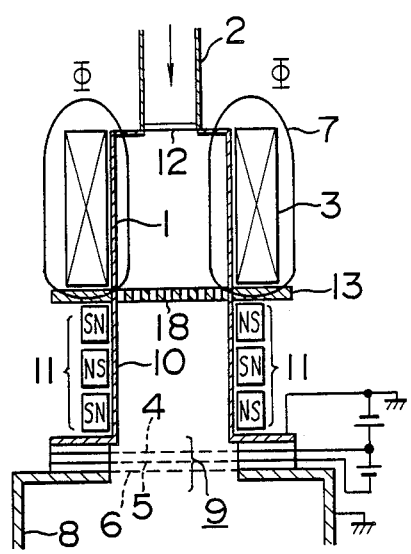
FIGS. 2, 3 and 4 are sectional views showing, respectively, second, third and fourth embodiments of the present invention.

FIG. 2 shows an ion source according to a second embodiment of the present invention. Referring to the figure, a partition plate 18 having a plurality of openings is disposed at the boundary between the vacuum container 1 and the plasma chamber 10. With this structure, there can be obtained similar effects to those of the first described embodiment of the invention.

Figure 3:
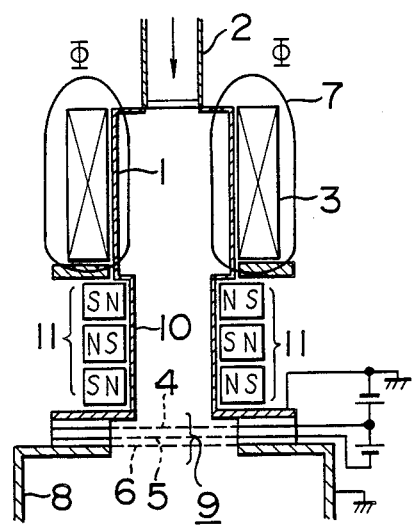
Figure 4:
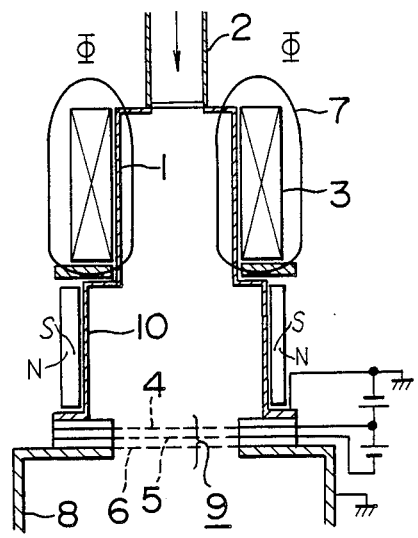

FIG. 3 shows a third embodiment of the present invention. In the case of this embodiment, the inner diameter of the plasma chamber 10 is selected smaller than that of the vacuum container 1. In contrast, in the case of a fourth embodiment shown in FIG. 4, the inner diameter of the plasma chamber 10 is selected greater than that of the vacuum chamber 1. In both of the embodiments shown in FIGS. 3 and 4, there can be obtained ions of low energy as compared with those produced in the ion source shown in FIG. 1 due to additional effect of adiabatic expansion.

In any of the embodiments of the invention described so far, the coil 3 and the permanent magnets 11 are both disposed externally of the vacuum chamber 1 and the plasma chamber 10. It should however be appreciated that effectiveness of the ion sources according to the invention can remain unchanged even when these magnetic means are provided internally.

As will be appreciated from the foregoing description, with the ion source arranged such that a plasma chamber is formed by extending the vacuum chamber for producing therein a plasma in the direction in which the microwave is introduced and that second magnetic means for producing a magnetic field of multicusp geometry is provided in association with the plasma chamber, ion density distribution of the ion beam as extracted from the plasma can be made very uniform in the radial direction of the beam. Further, by additionally providing the magnetic shield member between the first and second magnetic means, the divergence angle of the ion beam can be retained at an extremely small value. In this way, the ion source advantageously suited for the fine processing of semiconductors or the like can be realized, to great advantages.

We claim:

1. An ion source comprising:
   plasma producing chamber means having an interior supplied with a gas for producing a plasma by ionizing the gas with electrons accelerated by electron cyclotron action caused by microwave energy introduced into the chamber means and a magnetic field having a component in a direction parallel to a direction in which the microwave energy is introduced into the plasma producing chamber means;
   a plasma chamber formed by extension of the plasma producing chamber means in the same direction in which the microwave energy is introduced into the plasma producing chamber means;
   magnetic means associated with the plasma chamber for producing a magnetic field of cusp-like geometry for keeping the plasma away from a wall of the plasma chamber, the direction of the line of the magnetic field being reversed alternately; and
   beam extracting means provided at a position with respect to the plasma chamber opposite to a position at which the plasma producing chamber means is located with respect to the plasma chamber for extracting an ion beam from the plasma chamber.

2. An ion source according to claim 1, wherein the magnetic means is provided around an outer periphery or an inner periphery of the plasma chamber.

3. An ion source according to claim 1, further comprising a partition plate having a plurality of apertures therein disposed at a boundary between the plasma producing chamber and the plasma chamber.

4. An ion source according to claim 1, wherein the plasma chamber has an inner diameter smaller than the inner diameter of the plasma producing chamber means.

5. An ion source according to claim 1, wherein the plasma chamber has an inner diameter greater than the inner diameter of the plasma producing chamber means.

6. An ion source comprising:
   plasma producing chamber means having an interior supplied with a gas for producing a plasma by ionizing the gas with electrons accelerated by electron cyclotron action caused by microwave energy introduced into the chamber means and a magnetic field having a component in a direction parallel to a direction in which the microwave energy is introduced into the plasma producing chamber means;
   a plasma chamber formed by extension of the plasma producing chamber means in the same direction in which the microwave is introduced into the plasma producing chamber means;
   magnetic means associated with the plasma chamber for producing a magnetic field of cusp-like geometry for keeping the plasma away from a wall of the plasma chamber, the direction of the line of the magnetic field being reversed alternately;
   beam extracting means provided at a position with respect to the plasma chamber opposite to a position at which the plasma producing chamber means is located with respect to the plasma chamber for extracting an ion beam from the plasma chamber; and
   a magnetic shield member provided between the magnetic field generated by the magnetic means associated with the plasma chamber and the magnetic field having the parallel component to the direction in which the microwave energy is introduced into the plasma producing chamber means so as to prevent an interference between the respective magnetic fields.

7. An ion source according to claim 6 wherein the magnetic means is provided around an outer periphery or an inner periphery of the plasma chamber.

8. An ion source according to claim 6, further comprising a partition plate having a plurality of apertures therein disposed at a boundary between the plasma producing chamber means and the plasma chamber.

9. An ion source according to claim 6, wherein the plasma chamber has an inner diameter samller than the inner diameter of the plasma producing chamber means.

10. An ion source according to claim 6, wherein the plasma chamber has an inner diameter greater than the inner diameter of the plasma producing chamber means.

* * * * *